United States Patent
Sakao

[11] Patent Number: 5,940,702
[45] Date of Patent: *Aug. 17, 1999

[54] METHOD FOR FORMING A CYLINDRICAL STACKED CAPACITOR IN A SEMICONDUCTOR DEVICE

[75] Inventor: Masato Sakao, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/563,234

[22] Filed: Nov. 28, 1995

[30] Foreign Application Priority Data

Nov. 29, 1994 [JP] Japan .................................. 6-294395

[51] Int. Cl.⁶ .............................................. H01L 21/8242
[52] U.S. Cl. ........................................... 438/254; 438/397
[58] Field of Search .................................... 438/396, 397, 438/253, 254; 257/306, 307, 308

[56] References Cited

U.S. PATENT DOCUMENTS

| | | | |
|---|---|---|---|
| 5,185,282 | 2/1993 | Lee et al. .............................. | 438/396 |
| 5,284,787 | 2/1994 | Ahn ....................................... | 438/396 |
| 5,364,811 | 11/1994 | Ajika et al. .......................... | 438/396 |
| 5,391,511 | 2/1995 | Doan et al. .......................... | 438/396 |
| 5,508,222 | 4/1996 | Sakao .................................... | 438/253 |
| 5,866,453 | 2/1999 | Prall et al. ........................... | 438/253 |

OTHER PUBLICATIONS

"Novel Stacked Capacitor Cell for 64mb DRAM," W. Wakamiya et al., 1989 Symposium on VLSI Technology Digest of Technical Papers, pp. 69–70.

*Primary Examiner*—Peter Toby Brown
*Assistant Examiner*—Toniae M. Thomas
*Attorney, Agent, or Firm*—Young & Thompson

[57] ABSTRACT

In a method for forming a capacitor in a semiconductor device, an insulating film is formed on a semiconductor substrate, and an opening is formed through the insulating film. Then, a conductive film is formed to cover a side wall surface of the opening and an upper surface of the insulating film, and a whole surface is mechanically ground so as to selectively remove the conductive film on the upper surface of the insulating film so that the conductive film remains only in an inside of the opening. The remaining insulating film is removed so that a cylindrical electrode is formed of an upstanding remaining conductive film having the same height as the thickness of the removed insulating film.

8 Claims, 7 Drawing Sheets

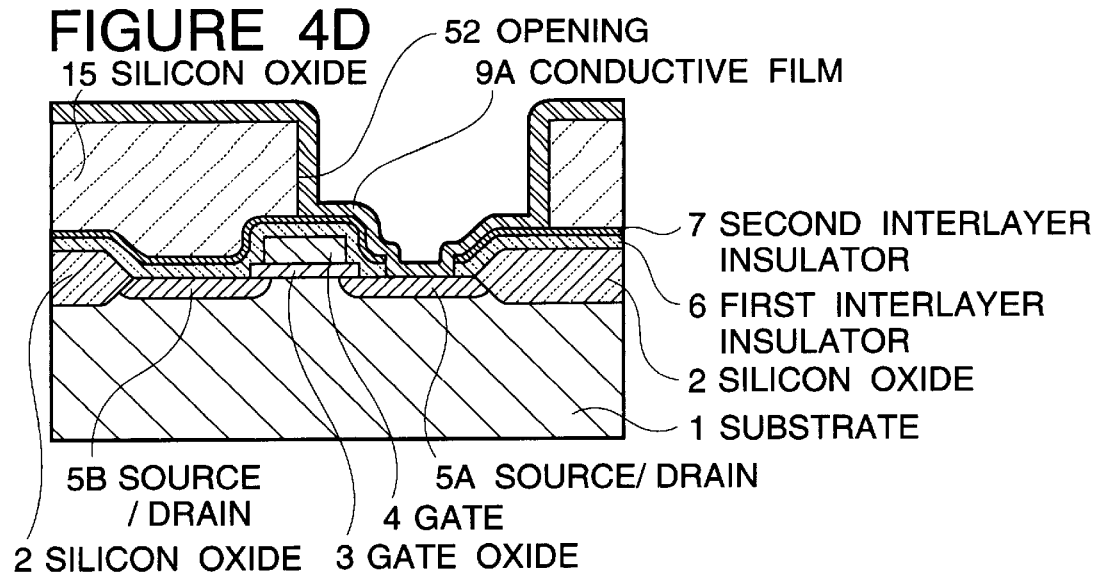
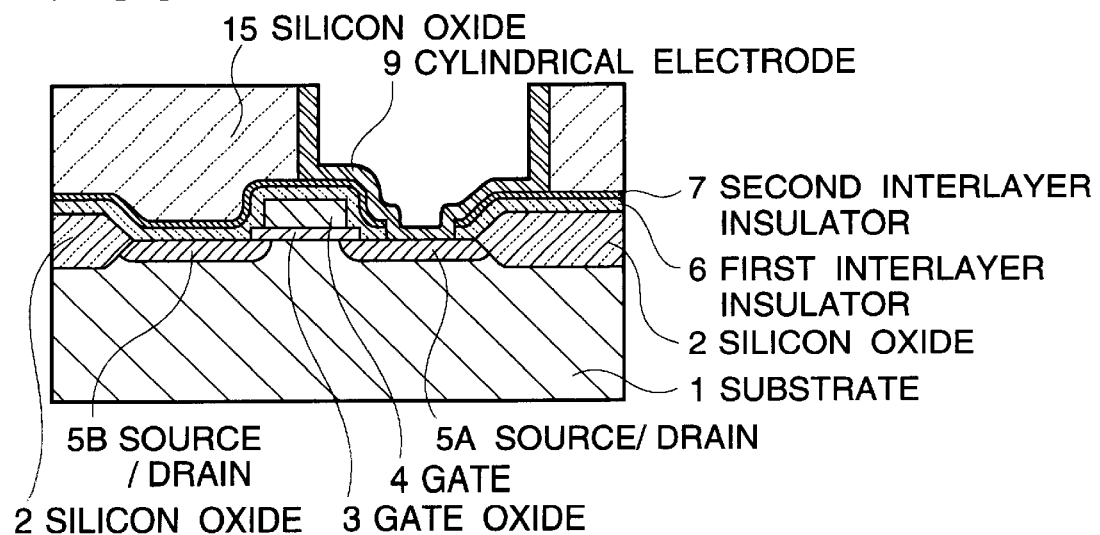
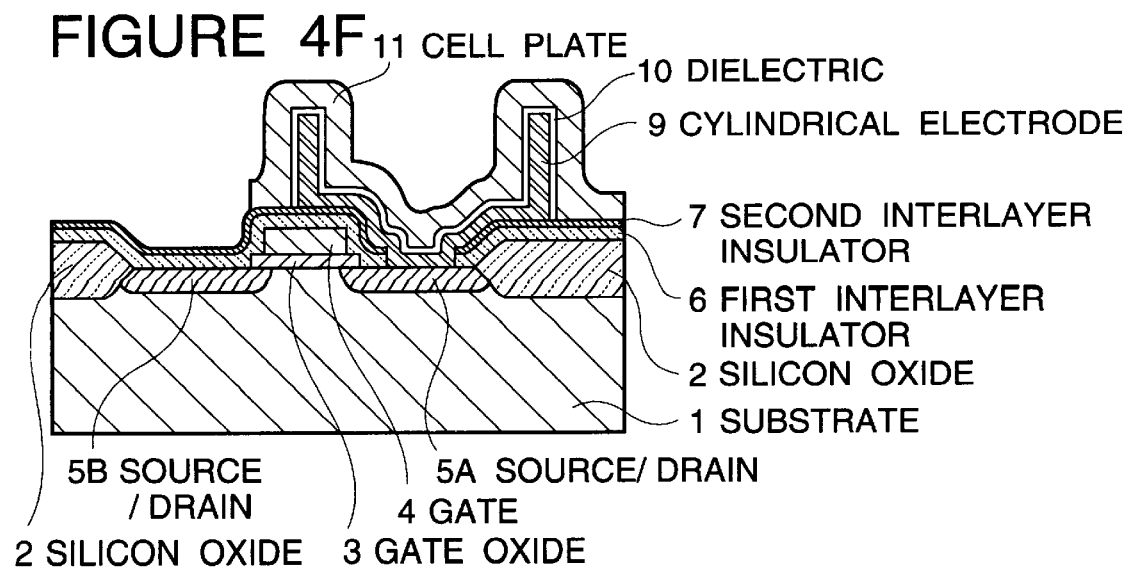

METHOD FOR FORMING A CYLINDRICAL STACKED CAPACITOR IN A SEMICONDUCTOR DEVICE

BACKGROUND OF THE INVENTION

1. Field of the Invention

The present invention relates to a method for manufacturing a semiconductor device, and more specifically to a method for forming a cylindrical stacked capacitor in a semiconductor integrated circuit memory.

2. Description of Related Art

As one of semiconductor integrated circuit memory cells having a high integration density, a so-called one-transistor type dynamic memory cell, composed of one transistor and one capacitor, is widely used, since it is constituted of a small number of circuit elements, and therefore, since a necessary memory cell area can be easily reduced. In the following, this type of memory cell will be called simply a "memory cell".

In this type of memory cell, the magnitude of an output voltage obtained from the memory cell is in proportion to the capacitance of the capacitor. Therefore, in order to ensure a stable operation, even if the size of the memory cell is reduced so as to elevate the integration density, it is necessary to maintain the capacitance of the capacitor at a sufficiently large value.

Referring to FIG. 1, there is shown one example of conventional memory cell envisaged to have a large capacitance of capacitor. In FIG. 1, not only the capacitor but also a MOS transistor connected to the capacitor are shown. The shown capacitor includes (1) a storage electrode constituted of a conductive member 8 contacted to an N-type source/drain region 5A and constituting a support or base member, and a cylindrical conductive member 9 connected to the base conductive member 8, (2) a cell plate 11, and (3) a dielectric film 10 insulating between the cell plate 11 and the storage electrode 8 and 9. A device isolation is made by a field isolation silicon oxide film 2 selectively formed on a P-type silicon substrate 1.

The MOS transistor includes a pair of N-type source/drain regions 5A and 5B formed in the P-type silicon substrate 1 separately from each other, and a gate electrode 4 formed on a gate oxide film 3 covering the surface of a region between the pair of N-type source/drain regions 5A and 5B. The gate electrode 4 also functions as a word line. In addition, a bit line (not shown) is connected to the N-type source/drain region 5B through a contact hole (not shown) formed through a first interlayer insulator film 6 and a second interlayer insulator film 7.

In this shown structure, the storage electrode of the capacitor is in a cylindrical form composed of the base conductive member 8 and the cylindrical conductive member 9. Therefore, not only an outer wall surface of the cylinder but also an inter wall surface of the cylinder can be utilized to constitute a capacitor. Accordingly, it is considered to be possible to give a sufficient capacitance value while effectively suppressing an increase of the memory cell area.

One process for forming the above mentioned cylindrical storage electrode is proposed by Wakamiya et al, "NOVEL STACKED CAPACITOR CELL FOR 64 Mb DRAM", 1989 Symposium on VLSI Technology Digest of Technical Papers, Pages 69–70, the disclosure of which is incorporated by reference in its entirety into this application. This process will be now described with reference to FIGS. 2A to 2C.

As shown in FIG. 2A, after the MOS transistor has been formed, a conductive member 8 contacted to the N-type source/drain region 5A is formed. Then, as shown in FIG. 2B, a silicon oxide film 15 having a substantial thickness is formed on the whole surface, and an opening is formed through the silicon oxide film 15 so as to expose a substantial portion of the conductive member 8. In addition, a conductive film 9A of a polysilicon is deposited on the silicon oxide film 15 and the conductive member 8 exposed in the opening. Furthermore, the conductive film 9A is etched back by a dry etching so as to form a conductive member 9 deposited on only an inner wall surface of the opening formed in the silicon oxide film 15, as shown in FIG. 2C. Then, the silicon oxide film is removed so that an upstanding cylindrical conductive member 9 remains. Thereafter, the dielectric film 10 and the cell plate 11 are formed as shown in FIG. 1.

In the above mentioned etch-back process, in order to prevent the conductive film 9A from being left on an upper surface of the silicon oxide film 15, it is necessary to over-etch the conductive film 9A as shown in FIG. 2C. In fact, however, the amount of this over-etching varies in the same chip and from one memory chip to another in the same wafer, by 10% or more. As a result, a variation occurs in the height of the cylindrical conductive member 9 which constitutes the storage electrode.

Here, since the height of the cylindrical conductive member 9 directly influences the capacitance value of the capacitor formed, a variation in the capacitance value of the capacitor formed in accordance with the above mentioned conventional process cannot be avoided. The variation in the capacitance value gives an adverse influence on a stable operation of the memory cells.

Accordingly, equalization of the amount of etch-back is very important to equalize the capacitance value of the capacitors, and therefore, to ensure the stable operation of the memory cells.

SUMMARY OF THE INVENTION

Accordingly, it is an object of the present invention to provide a method for forming a capacitor in a semiconductor integrated circuit memory, which has overcome the above mentioned defect of the conventional one.

Another object of the present invention is to provide a method for forming a capacitor in a semiconductor integrated circuit memory having a high integration density, which method can prevent the variation of the capacitance value, and therefore can ensure the stable operation of the semiconductor integrated circuit memory.

The above and other objects of the present invention are achieved in accordance with the present invention by a method for forming a capacitor in a semiconductor device, comprising the steps of forming an insulating film on a semiconductor substrate, forming an opening through the insulating film, forming a conductive film to cover at least a side wall surface and a bottom of the opening and an upper surface of the insulating film, grinding a whole surface so as to selectively remove the conductive film on the upper surface of the insulating film so that the conductive film remains only in an inside of the opening, removing the insulating film so that a cylindrical electrode is formed of an upstanding remaining conductive film, forming an insulating layer covering an exposing surface of the cylindrical electrode including an inner wall surface and an outer wall surface, and forming an opposing electrode covering the insulating layer, so that a capacitor is formed of a stacked structure composed of the cylindrical electrode, the insulating layer and the opposing electrode.

The above and other objects, features and advantages of the present invention will be apparent from the following description of preferred embodiments of the invention with reference to the accompanying drawings.

BRIEF DESCRIPTION OF THE DRAWINGS

FIGS. 4A to 4F are diagrammatic sectional views for illustrating the first embodiment of the method in accordance with the present invention for forming the cylindrical capacitor shown in FIG. 3.

DESCRIPTION OF THE PREFERRED EMBODIMENTS

Figure 1:
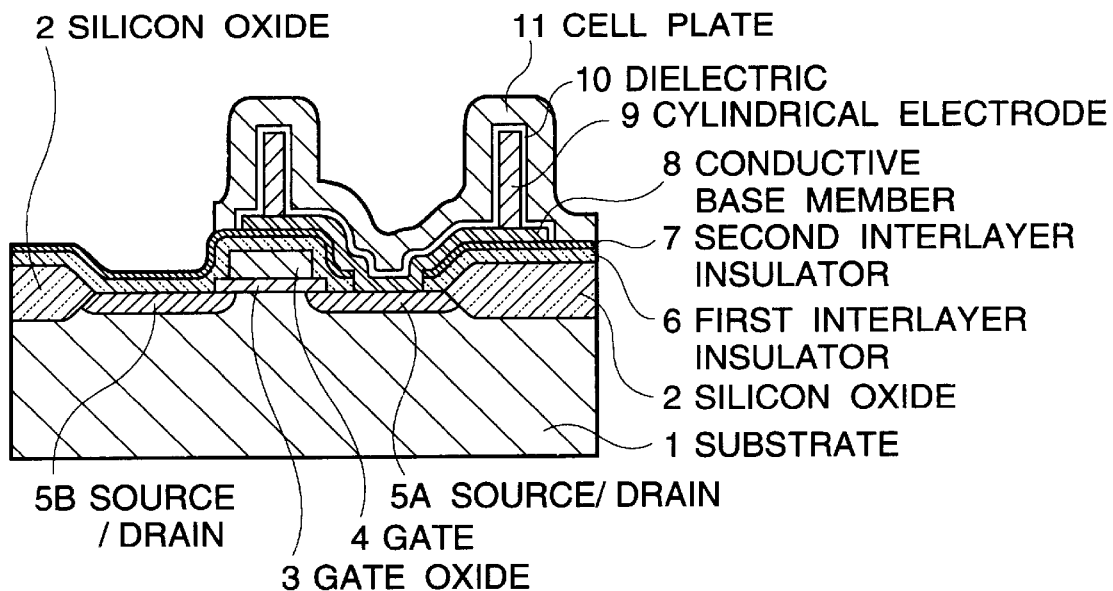
FIG. 1 is a diagrammatic sectional view showing one example of conventional memory cell envisaged to have a large capacitance of capacitor in the one-transistor type DRAM memory.
Figure 3:
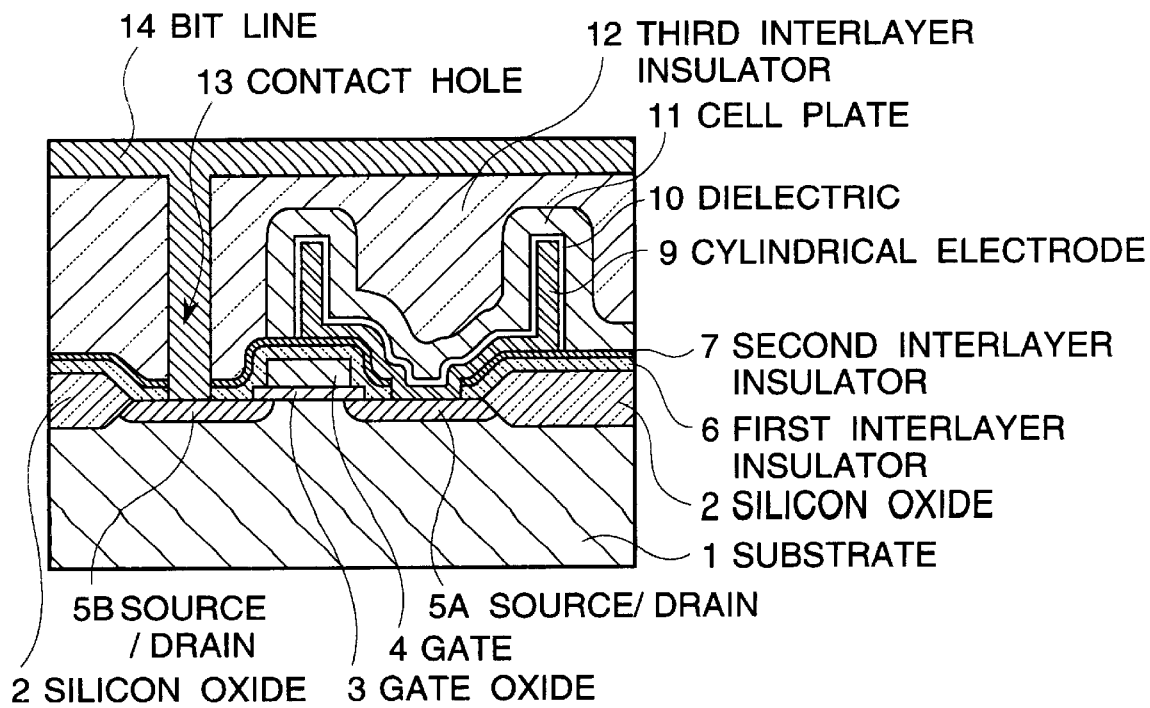
FIG. 3 is a diagrammatic sectional view showing a one-transistor type DRAM memory cell having a cylindrical capacitor formed in accordance with a first embodiment of the method in accordance with the present invention for forming a capacitor in a semiconductor integrated circuit memory.

Referring to FIG. 3, there is shown a one-transistor type DRAM memory cell having a cylindrical capacitor formed in accordance with a first embodiment of the method in accordance with the present invention for forming a capacitor in a semiconductor integrated circuit memory. In FIG. 3, elements similar to those shown in FIG. 1 are given the same Reference Numerals.

The one-transistor type DRAM memory cell includes a MOS transistor formed in a device formation zone defined by a field isolation silicon oxide 2 formed on a principal surface of a P-type silicon substrate 1. This MOS transistor comprises a pair of N-type source/drain regions 5A and 5B formed at a surface region of the P-type silicon substrate 1 separately from each other, and a gate electrode 4 formed on a gate oxide film 3 covering the surface of a region between the pair of N-type source/drain regions 5A and 5B. A stacked insulator film, composed of a first interlayer insulating film 6 and a second interlayer insulating film 7, is deposited on the whole surface to cover the field isolation silicon oxide 2, the pair of N-type source/drain regions 5A and 5B and the gate electrode 4.

The capacitor associated with the above mentioned MOS transistor comprises a cylindrical storage electrode 9 formed of a conductive material and contacted to the N-type source/drain region 5A through a contact hole formed through the first interlayer insulating film 6 and the second interlayer insulating film 7, a cell plate 11 opposing to the cylindrical storage electrode 9, and a capacitor dielectric film 10 separating between the cylindrical storage electrode 9 and the cell plate 11. A third interlayer insulating film 12 is formed on the whole surface to cover the second interlayer insulating film 7 and the cell plate 1. A contact hole 13 is formed through the first to third interlayer insulating films 6, 7 and 12 at a position of the other source/drain region 5B, and a bit line 14 is formed on the third interlayer insulating film 12 and is connected to the source/drain region 5B through the contact hole 13. The bit line 14 and the contact 13 are electrically insulated from the cell plate 11 by the third interlayer insulating film 12. Incidentally, the gate electrode 4 also functions as a word line.

Now, the first embodiment of the method in accordance with the present invention for forming the cylindrical capacitor shown in FIG. 3 will be described with reference to FIGS. 4A to 4F.

Figure 4A:
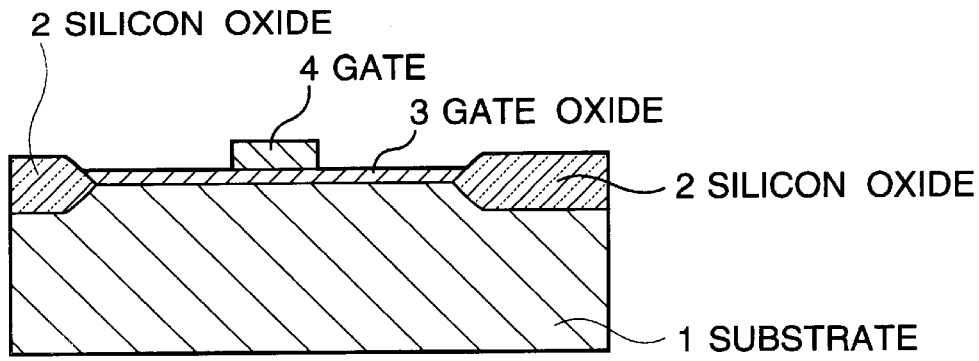

As shown in FIG. 4A, a thermally oxidized film (not shown) is formed on a principal surface of a P-type silicon substrate 1 having a plane orientation (100), and a silicon nitride film (not shown) having a thickness of about 120 nm is deposited on the thermally oxidized film by a CVD (chemical vapor deposition) process. The stacked film composed of the thermally oxidized film and the silicon nitride film is patterned by a photolithography so that a mask oxide film and the silicon nitride film remains only a predetermined zone, and then, a thermal oxidation is performed against the substrate so that a silicon oxide film 2 having a thickness of about 600 nm is formed, as a field isolation, on the principal surface of the P-type silicon substrate 1 so as to partition a device formation zone on the principal surface of the P-type silicon substrate 1. Furthermore, the mask oxide film and the silicon nitride film are removed by a wet etching. Thereafter, the substrate is oxidized in an oxidizing atmosphere of 950° C., so that a gate insulating film 3 composed of a silicon oxide film having a thickness of about 20 nm is formed on the device formation zone. Furthermore, a polysilicon film having a thickness of 500 nm is deposited by a CVD process, and the deposited polysilicon film is patterned by a conventional photolithography and dry etching, so as to form a gate electrode 4.

Figure 4B:
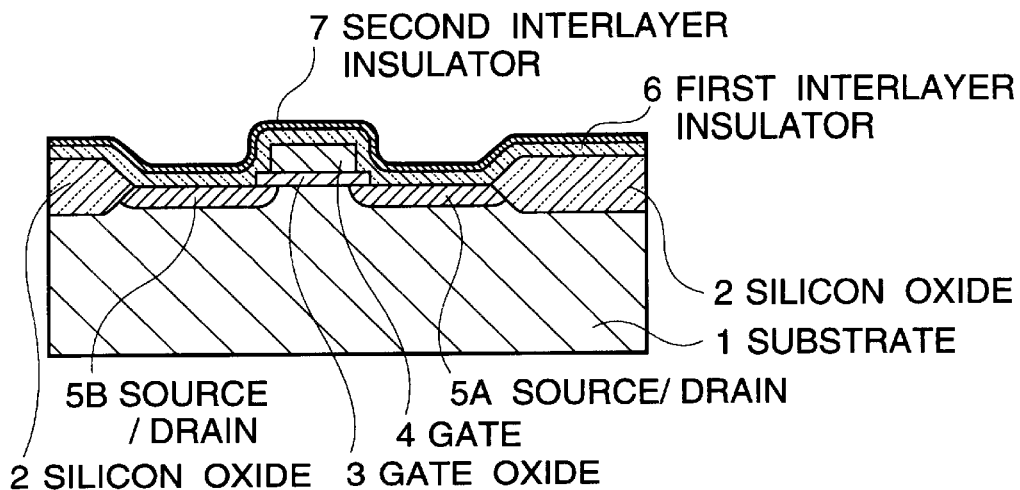

Then, arsenic is ion-implanted at an acceleration energy of 100 KeV with a dose of $5 \times 10^{15}$ cm$^{-2}$ so that a pair of N-type source/drain regions 5A and 5B are formed in a surface region of the silicon substrate 1, as shown in FIG. 4B. Furthermore, a wet etching is performed to remove the oxide film so that only the gate oxide film 3 directly under the gate electrode 4 remains. In addition, a silicon oxide film is deposited by the CVD process to form a first interlayer insulating film 6, and a silicon nitride film is also deposited by the CVD process to form a second interlayer insulating film 7.

Figure 4C:
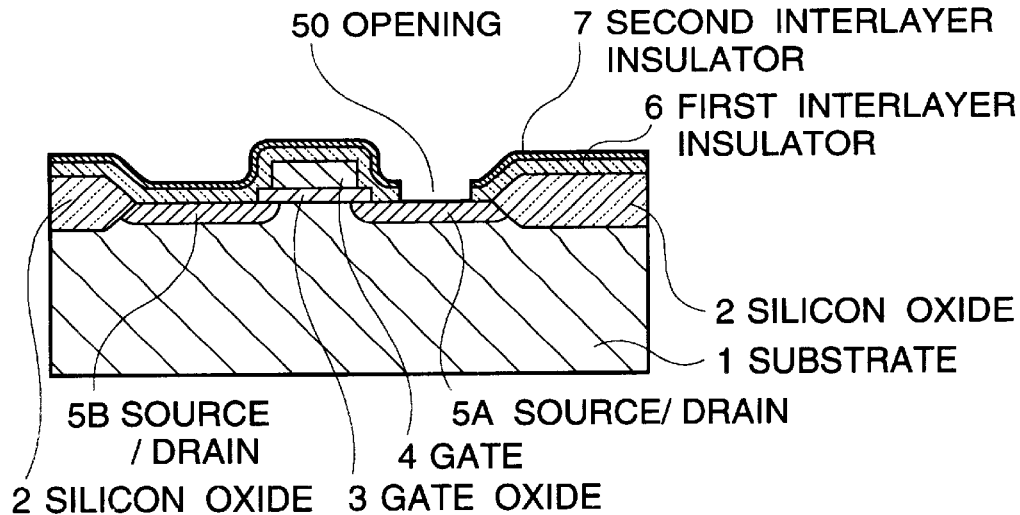

As shown in FIG. 4C, an opening 50 is formed to pass through the first interlayer insulating film 6 and the second interlayer insulating film 7, so that the formed opening 50 exposes a portion of the N-type source/drain region 5A. Thereafter, a silicon oxide film 15 having a substantial thickness corresponding to a desired height of a cylindrical storage electrode, is deposited, by the CVD process, on the whole surface of the substrate including the second interlayer insulating film 7 and the N-type source/drain region 5A exposed in the opening 50.

Then, a large opening 52 is formed by an etching to pass through the silicon oxide film 15 so as to surround the opening 50. Thus, the N-type source/drain region 5A is exposed again in the opening 50 within the opening 52. For example, the opening 52 has a diameter reaching from the field oxide 2 to a center position of the gate electrode 4. In this etching process, by selecting an etching condition for removing the silicon oxide film 15, the etching of the silicon oxide film 15 is automatically stopped by the surface of the second interlayer silicon nitride film 7. Thereafter, a polysilicon film 9A is deposited to cover the silicon oxide film 15, a side wall surface and a bottom surface of the opening 52, and a side wall surface and a bottom surface of the opening 50, and then,phosphorus is thermally diffused into the deposited polysilicon film so that a conductive film 9A is formed.

Thereafter, the conductive film 9A is selectively ground. This selective polishing is a mechanical chemical grinding of the polysilicon, which is performed by using for example a pad formed mainly of a polyurethane and an organic amine as a polishing liquid. In this grinding process, since the grinding of the silicon oxide film is almost negligible in comparison with a grinding speed of the polysilicon, a substantially selective grinding is performed. Namely, only the conductive film 9A on the silicon oxide film 15 is ground, and as soon as the silicon oxide film 15 is exposed, the grinding is not further advanced. The reason for this is that, since the surface of the silicon oxide surface 15 is not ground, the mechanical chemical polishing does not advance downward from the surface of the silicon oxide film 15, and the surface of the silicon oxide film 15 functions as a stopper against a further advance of the grinding. As a result, the selective grinding is automatically stopped at the surface of the silicon oxide surface 15. Therefore, the conductive film 9A remains only in the opening 52, so that at a side wall surface of the opening 15, there is formed a cylindrical conductive member 9 having the same height as that of the silicon oxide film 15, as shown in FIG. 4E.

Thereafter, the silicon oxide film 15 is removed by a wet-etching using for example a hydrofluoric acid aqueous solution, so that the second interlayer insulating film 7 formed of a silicon nitride film functions as an etching stopper, whereby only the silicon oxide film 15 is selectively removed by the etching.

Then, as shown in FIG. 4F, the conductive member 9 is thermally oxidized to form a dielectric layer 10 for a capacitor, and thereafter, a polysilicon film is deposited by a CVD process, and phosphorus is thermally diffused into the deposited polysilicon film. Thereafter, the deposited polysilicon film is patterned by a photolithography and a dry etching, to form a cell plate 11. Thus, the dielectric layer 10 and the cell plate 11 for a capacitor are formed as shown in FIG. 4E.

Furthermore, a silicon oxide film is deposited on the whole surface by a CVD process, so as to form a third interlayer insulating film 12 as shown in FIG. 3, and then, a contact hole 13 reaching the other source/drain region 5B is formed to pass through the first to third interlayer insulating films 6, 7 and 12. An aluminum film is deposited, and then, patterned to form a bit line 14 connected to the source/drain region 5B through the contact hole 13.

Thus, the memory cell having a stacked capacitor including the cylindrical storage electrode as shown in FIG. 3 is obtained.

Next, with reference to FIGS. 5A to 5E, a second embodiment of the method in accordance with the present invention for forming a capacitor in a semiconductor integrated circuit memory, will be explained. In FIGS. 5A to 5E, elements similar to those shown in FIGS. 4A to 4F are given the same Reference Numerals.

Figure 5A:
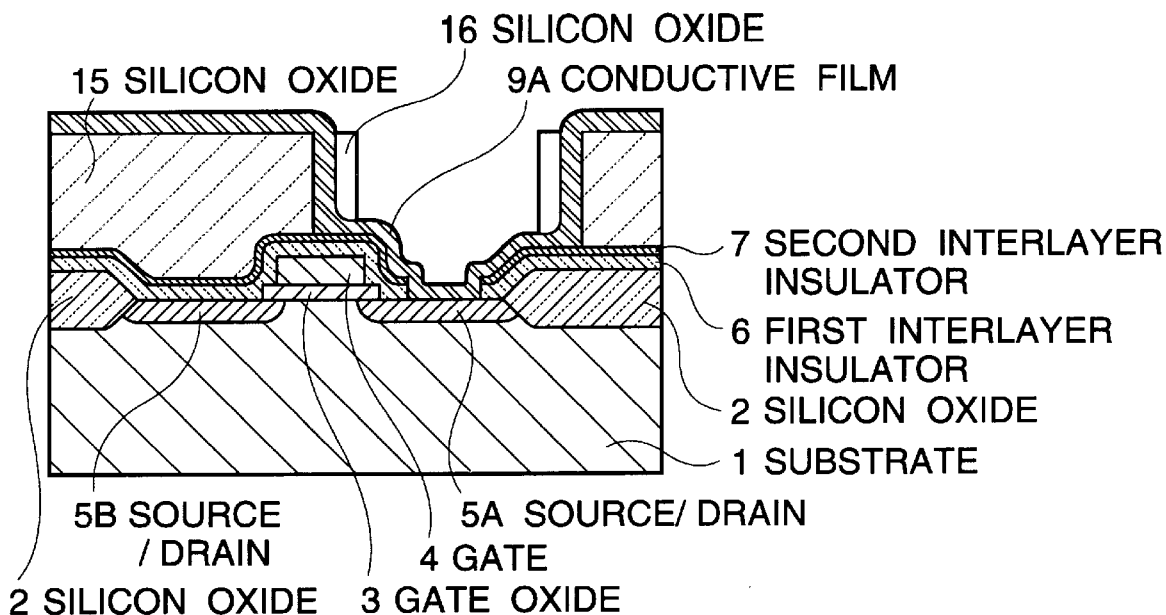
Figures 5A to 5E are diagrammatic sectional views for illustrating the second embodiment of the method in accordance with the present invention for forming a capacitor in a semiconductor integrated circuit memory.

In a condition shown in FIG. 4D, another silicon oxide film is deposited on the whole surface by a CVD process, and an etching-back is performed by a dry etching, so that as shown in FIG. 5A, a silicon oxide film 16 remains on only an inner side wall surface of the first conductive film 9A.

Figure 5B:
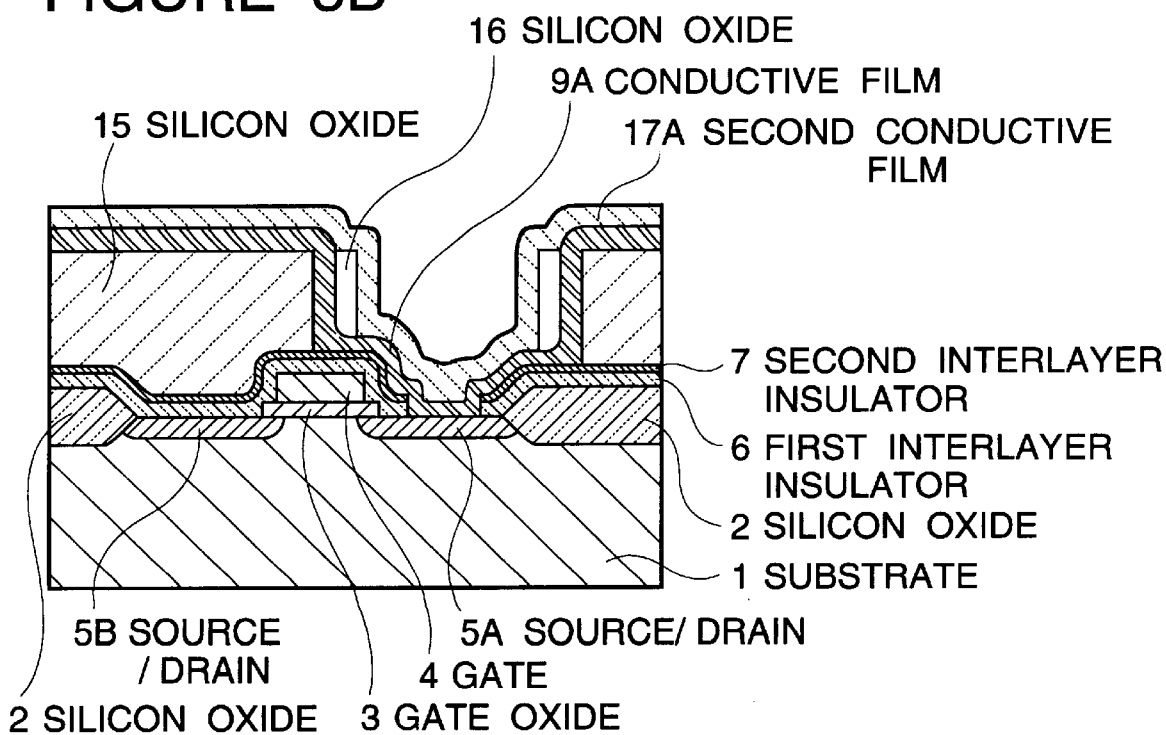
Figure 5C:
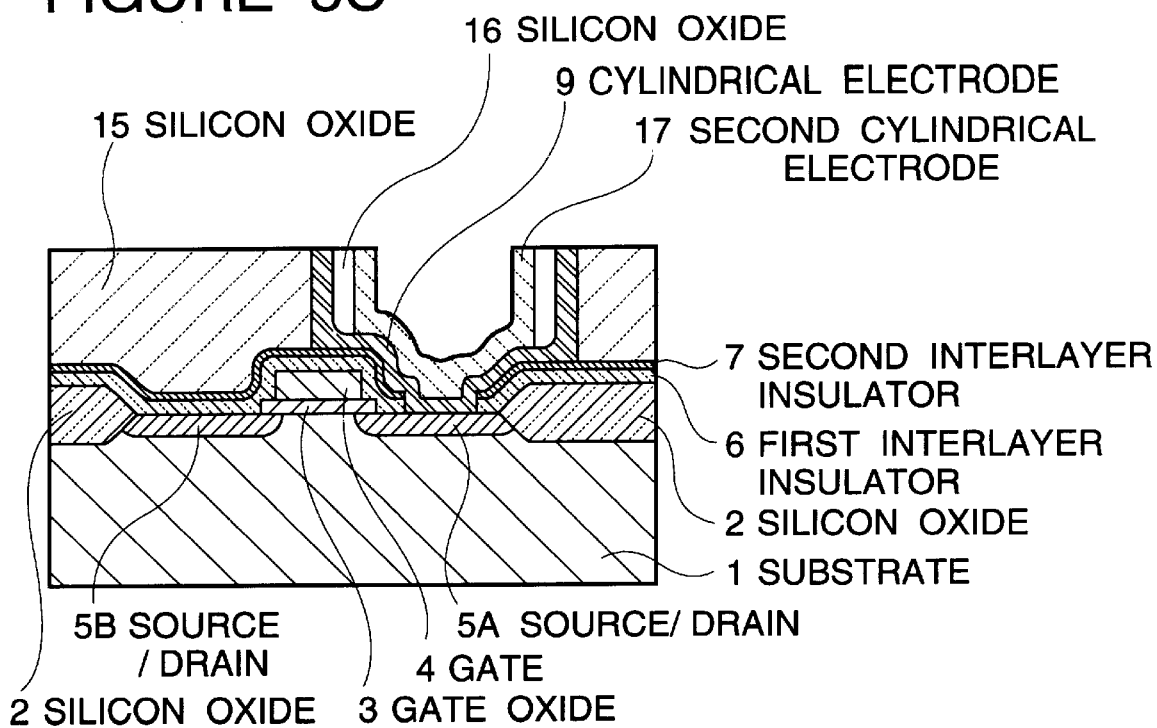

Succeedingly, a second conductive film 17A, formed of for example a polysilicon film, is deposited on the whole surface, as shown in FIG. 5B. In this condition, the selective grinding similar to that performed in the first embodiment is performed. Accordingly, since the grinding advances until the silicon oxide film 16 is exposed, and since the grinding automatically stops when the silicon oxide film 16 is exposed, there is formed a coaxial double cylindrical storage electrode composed of the first cylindrical conductive member 9 and the second cylindrical conductive member 17, both of which have the same height as that of the surface of the oxide silicon film 15, as shown in FIG. 5C.

Thereafter, the first silicon film 15 and the oxide silicon film 16 are selectively removed by a wet-etching using for example a hydrofluoric acid aqueous solution, so that the second interlayer insulating film 7 formed of a silicon nitride film functions as an etching stopper, whereby only the first silicon film 15 and the oxide silicon film 16 are removed by the etching.

Figure 5D:
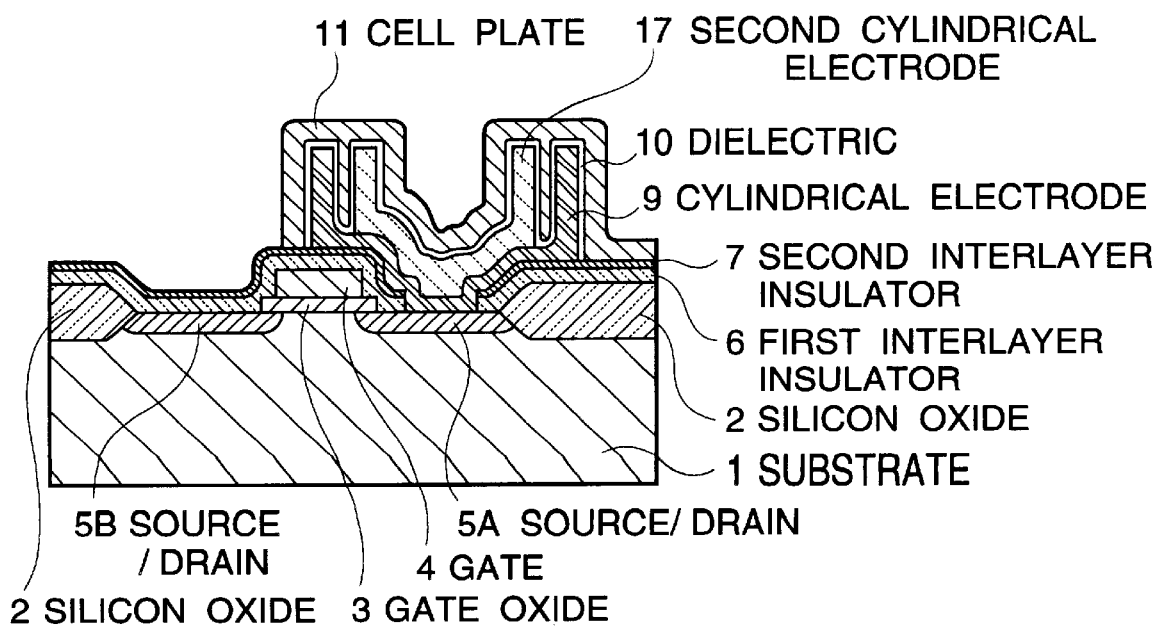

Then, as shown in FIG. 5D, the first conductive member 9 and the second conductive member 17 are thermally oxidized to form a dielectric layer 10 for a capacitor, and thereafter, a polysilicon film is deposited by a CVD process, and phosphorus is thermally diffused into the deposited polysilicon film. Thereafter, the deposited polysilicon film is patterned by a photolithography and a dry etching, to form a cell plate 11.

Figure 5E:
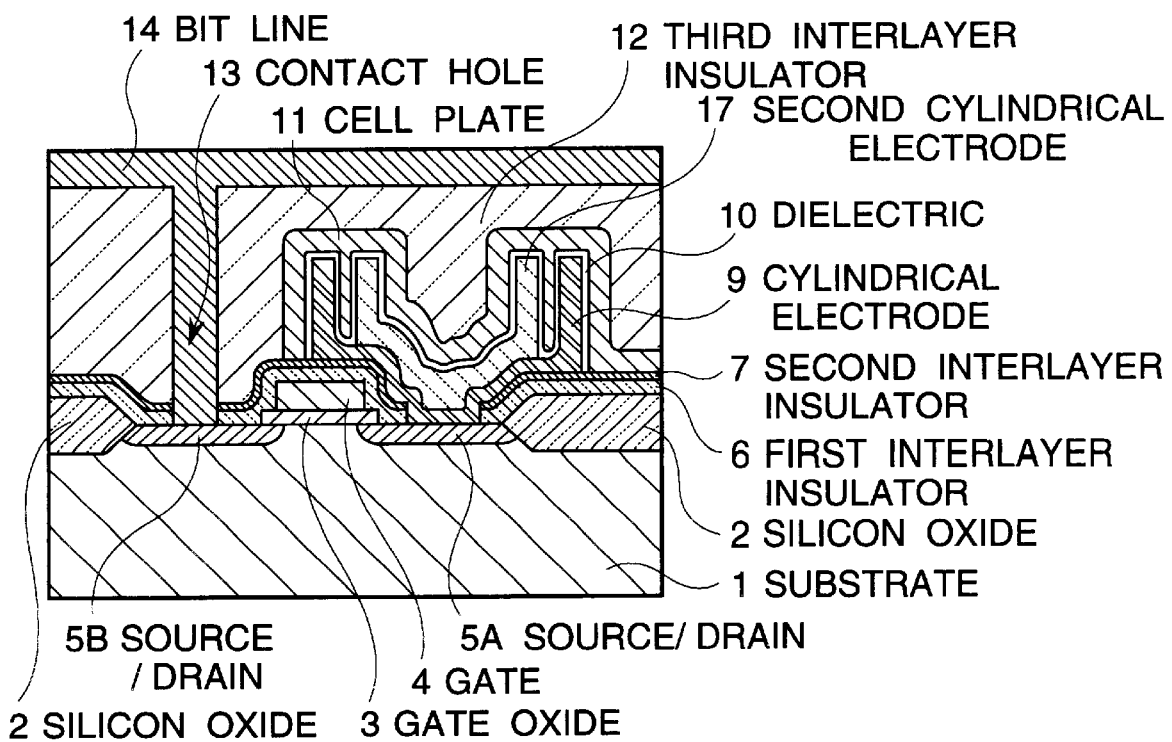

Furthermore, a silicon oxide film is deposited on the whole surface by a CVD process, so as to form a third interlayer insulating film 12 as shown in FIG. 5E, and then, a contact hole 13 reaching the other source/drain region 5B is formed to pass through the first to third interlayer insulating films 6, 7 and 12. An aluminum film is deposited, and then, patterned to form a bit line 14 connected to the source/drain region 5B through the contact hole 13.

Thus, the memory cell having a stacked capacitor including the double cylindrical storage electrode as shown in FIG. 5E is obtained.

In the above mentioned embodiments, the capacitor dielectric film 10 is formed of the thermally oxidized film of a silicon. However, to increase the capacitance and to elevate the reliability, the capacitor dielectric film 10 can be formed of a single layer of either a silicon oxide or a silicon nitride, or a double- or triple-layer structure composed of a silicon oxide film or a silicon nitride film.

Figure 2A:
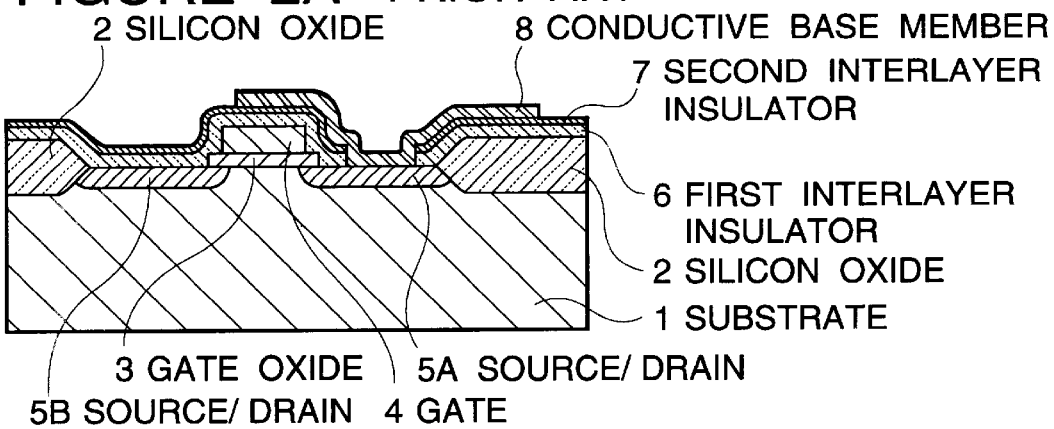
FIGS. 2A to 2C are diagrammatic sectional views for illustrating a conventional process for forming the cylindrical capacitor shown in FIG. 1.
Figure 2B:
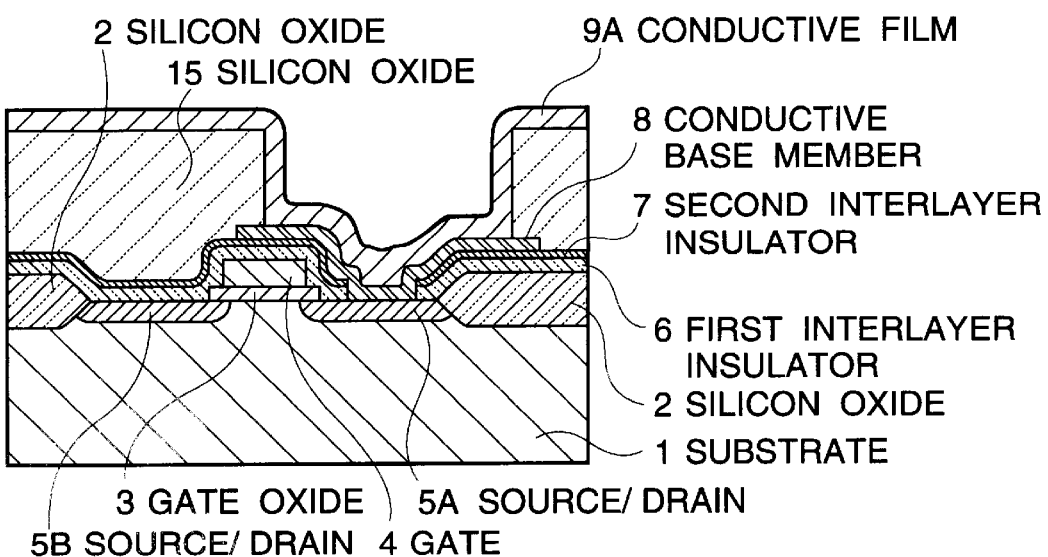
Figure 2C:
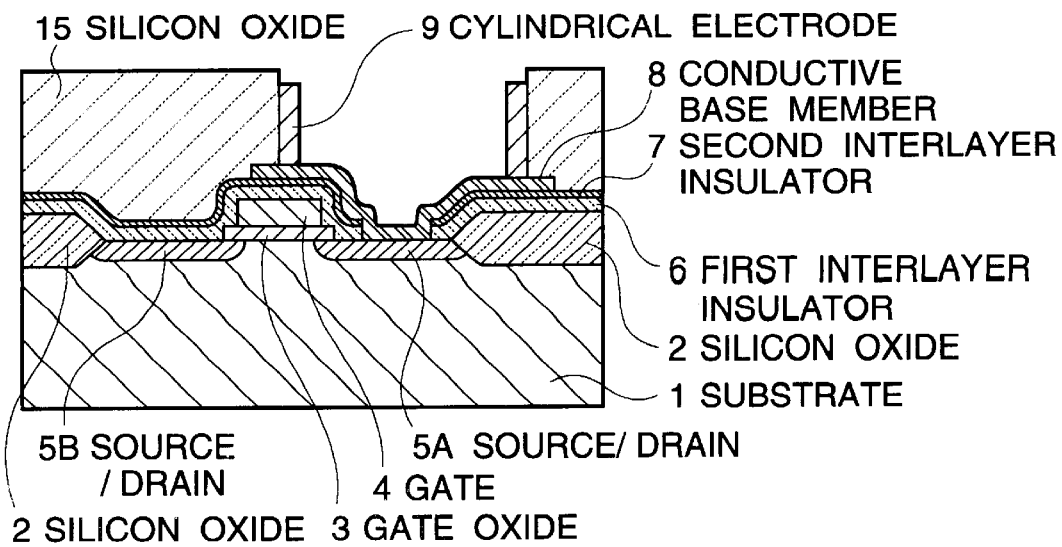

In the above mentioned embodiments, further, the base conductive member 8 formed in the conventional example is not formed in order to realize the sectional structure shown in FIG. 4D. Therefore, the process of the shown embodiments is simpler than that of the conventional example. However, in place of the sectional structure shown in FIG. 4D, the sectional structure shown in FIG. 2B may be formed similarly to the conventional example. In other words, the gist of the present invention is characterized by the process going from the condition illustrated in FIG. 4D to the condition illustrated in FIG. 4E. The process until FIG. 4D and the process after FIG. 4E can be selected freely.

In addition, in the shown embodiments, the bit line 14 is formed of an aluminum film and located at a level higher than that of the storage electrode. However, the bit line can be formed of a silicide having a melting point higher than that of aluminum, and may be located underneath the storage electrode.

Furthermore, the shown embodiments are examples of a high density semiconductor memory applied with the present invention, but the present invention can be applied not only to the high density semiconductor memory but also the other semiconductor device.

As seen from the above, in accordance with the method of the present invention, since the selective grinding is carried out in order to form a cylindrical storage electrode of a cylindrical capacitor which can effectively realize a large capacitance in a small memory cell area, it is possible to make the height of storage electrodes constant in the same wafer and from one wafer to another. Therefore, capacitors included in the semiconductor devices can have a capacitance having no substantial variation.

Specifically, the conventional process causes 10% or more of variation in the etch-back amount, resulting in a corresponding variation of the height of the storage electrode and hence the capacitance of the capacitors. However, the selective grinding in the present invention can reduce the variation in the etch-back amount to almost zero (0). Therefore, the selective grinding in the present invention should be understood not include the wet etching and the dry etching.

The invention has thus been shown and described with reference to the specific embodiments. However, it should be noted that the present invention is in no way limited to the details of the illustrated structures but changes and modifications may be made within the scope of the appended claims.

I claim:

1. A method for forming a capacitor in a semiconductor device, comprising the steps of:

forming a silicon nitride film on a semiconductor substrate:

forming an insulating film of silicon oxide on an upper surface of said silicon nitride film;

forming an opening through the insulating film by etching so that the etching of the silicon oxide is automatically stopped by the surface of said silicon nitride film;

forming a conductive film to cover at least a side wall surface and a bottom of the opening and an upper surface of the insulating film;

grinding a whole surface by mechanical chemical polishing so as to selectively remove the conductive film on the upper surface of the insulating film so that the conductive film remains only in an inside of the opening;

removing the insulating film by etching so that the etching of the silicon oxide is automatically stopped by the surface of said silicon nitride film, so that a cylindrical electrode upstanding from said upper surface of said silicon nitride film and having a height that is the same as a level of said upper surface of said insulating film, is formed of an upstanding remaining conductive film;

forming an insulating layer covering an exposing surface of the cylindrical electrode including an inner wall surface and an outer wall surface; and forming an opposing electrode covering the insulating layer, so that a capacitor is formed of a stacked structure composed of the cylindrical electrode, the insulating layer and the opposing electrode.

2. A method claimed in claim 1 wherein said conductive film is formed of a polysilicon, and wherein said mechanical chemical polishing is performed using a pad of polyurethane and a polishing liquid of organic amine.

3. A method claimed in claim 1, further including the steps of, after said conductive film is formed, forming a second insulating film of silicon oxide on said conductive film, selectively removing said second insulating film so that said second insulating film remains only on said conductive film within said opening and said first named conductive film is exposed at said bottom of said opening, forming a second conductive film to cover at least said remaining second insulating film and said first named conductive film remaining on said bottom of said opening, and wherein said mechanical chemical polishing is made on a whole surface so as to selectively remove the first named conductive film and said second conductive film on the upper surface of the first named insulating film so that the first named conductive film and said second conductive film remain only in the inside of the opening, and then, the first named insulating film and said second insulating film are removed by etching so that the etching of the silicon oxide of the first named insulating film and said second insulating film is automatically stopped by the surface of said silicon nitride film, so that a double cylindrical electrode is formed of an upstanding remaining first named conductive film and an upstanding remaining second named conductive film, and further, said forming of said insulating layer is made to cover said exposing surface of said double cylindrical electrode including an inner wall surface and an outer wall surface of each of said upstanding remaining first named conductive film and said upstanding remaining second named conductive film, and then, said opposing electrode is formed to cover said insulating layer, so that a capacitor is formed of a stacked structure composed of said double cylindrical electrode, said insulating layer and said opposing electrode.

4. A method claimed in claim 3 wherein said first named conductive film and said second conductive are formed of a polysilicon.

5. A method for forming a capacitor in a semiconductor device, comprising the steps of:

defining a device formation zone on a semiconductor substrate;

forming a silicon oxide film to cover a principal surface of said semiconductor substrate including said device formation zone;

forming a silicon nitride film on an upper surface of said silicon oxide film;

selectively removing said silicon nitride film and said silicon oxide film on said device formation zone so as to form a contact hole exposing a portion of said device formation zone;

forming an insulating film of silicon oxide to cover an upper surface of said silicon nitride film and said portion of said device formation zone exposed in said contact hole;

selectively removing said insulating film on said device formation zone by etching so that the etching of the silicon oxide of said insulating film is automatically stopped by the surface of said silicon nitride film, so as to form an opening passing through the insulating film and exposing said portion of said device formation zone exposed in said contact hole;

forming a conductive film to cover at least a side wall surface and a bottom of said opening and an upper surface of the insulating film so that said conductive film is electrically contacted to said device formation zone in said contact hole;

mechanically grinding a whole surface by mechanical chemical polishing so that because of a difference in the grinding speed between said conductive film and said insulating film, only said conductive film on said upper surface of said insulating film is selectively removed, but said conductive film remains only on said side wall surface and said bottom of said opening, in electrical contact with said device formation zone, the remaining conductive film upstanding from said upper surface of said silicon nitride film and having a height that is the same as a level of said upper surface of said insulating film;

chemically removing said insulating film by etching so that the etching of the silicon oxide of said insulating film is automatically stopped by the surface of said silicon nitride film, so that a cylindrical electrode is formed of the upstanding remaining conductive film;

forming a dielectric film covering an exposing surface of said cylindrical electrode including an inner wall surface and an outer wall surface, and forming an opposing electrode to cover said dielectric film, so that a capacitor is formed of a stacked structure composed of said cylindrical electrode, said dielectric film and said opposing electrode.

6. A method claimed in claim 5 wherein said conductive film is formed of a polysilicon and wherein said mechanical chemical polishing is performed using a pad of polyurethane and a polishing liquid of organic amine.

7. A method claimed in claim 5, further including the steps of: after said conductive film is formed, forming a second insulating film of silicon oxide on said conductive film;

selectively removing said second insulating film so that said second insulating film remains only on said conductive film within said opening and said first named conductive film is exposed at said bottom of said opening; and forming a second conductive film to cover at least said remaining second insulating film and said first named conductive film remaining on said bottom of said opening, so that said second conductive film is electrically contacted with the first named conductive film, and wherein said mechanical chemical polishing is made on a whole surface so as to selectively remove the first named conductive film and said second conductive film on the upper surface of the first named insulating film so that the first named conductive film and said second conductive film remain only in the inside of the opening, and then, the first named insulating film and said second insulating film are chemically removed by etching so that the etching of the silicon oxide of the first named insulating film and said second insulating film is automatically stopped by the surface of said silicon nitride film, so that a double cylindrical electrode is formed of an upstanding remaining first named conductive film and an upstanding remaining second named conductive film, and further, said forming of said dielectric film is made to cover said exposing surface of said double cylindrical electrode including an inner wall surface and an outer wall surface of each of said upstanding remaining first named conductive film and said upstanding remaining second named conductive film, and then, said opposing electrode covering said dielectric film is formed, so that a capacitor is formed of a stacked structure composed of said double cylindrical electrode, said dielectric film and said opposing electrode.

8. A method claimed in claim 7 wherein said first named conductive film and said second conductive are formed of a polysilicon.

* * * * *